(12) United States Patent
Wei et al.

(10) Patent No.: US 11,916,286 B2
(45) Date of Patent: Feb. 27, 2024

(54) ELECTRONIC DEVICE AND ANTENNA FEEDING DEVICE

(71) Applicant: WISTRON NEWEB CORPORATION, Hsinchu (TW)

(72) Inventors: Shih-Chiang Wei, Hsinchu (TW); Hsieh-Chih Lin, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 296 days.

(21) Appl. No.: 17/348,838

(22) Filed: Jun. 16, 2021

(65) Prior Publication Data

US 2022/0285833 A1 Sep. 8, 2022

(30) Foreign Application Priority Data

Mar. 8, 2021 (TW) .................................. 110108128

(51) Int. Cl.
*H01Q 1/48* (2006.01)
*H01Q 1/50* (2006.01)
(Continued)

(52) U.S. Cl.
CPC .................. *H01Q 1/48* (2013.01); *H01Q 1/50* (2013.01); *H05K 9/0067* (2013.01); *H01Q 1/241* (2013.01); *H01Q 1/38* (2013.01)

(58) Field of Classification Search
CPC ............ H01Q 1/48; H01Q 1/38; H01Q 1/243; H01Q 1/50; H01Q 1/241; H01Q 5/378;
(Continued)

(56) References Cited

U.S. PATENT DOCUMENTS 8,045,312 B2 * 10/2011 Shrier .................. H05K 1/0256
361/111
8,577,289 B2 * 11/2013 Schlub .................. G01B 7/023
343/702
(Continued)

FOREIGN PATENT DOCUMENTS

CN 202183791 U 4/2012
DE 10204079 A1 * 8/2003 ............. H01Q 1/243
(Continued)

*Primary Examiner* — Dimary S Lopez Cruz
*Assistant Examiner* — Brandon Sean Woods
(74) *Attorney, Agent, or Firm* — McClure, Qualey & Rodack, LLP

(57) ABSTRACT

An electronic device and an antenna feeding device are provided. The electronic device includes a metal housing, a radiation element, a substrate, a grounding element and an electrostatic protection element. The antenna feeding device includes a substrate, a grounding element, and an electrostatic protection element. The radiation element is arranged along the edge of the electronic device, and the radiation element and the metal housing are separated from each other. The substrate is arranged on the metal housing. The substrate includes a feeding portion and a grounding portion, and the feeding portion is coupled to the radiating element. The grounding portion is coupled to the metal housing. The grounding element is electrically connected to the metal housing, and the grounding element is coupled to the grounding portion. The electrostatic protection element is electrically connected between the feeding portion and the grounding portion.

18 Claims, 7 Drawing Sheets

(51) Int. Cl.
  *H05K 9/00*        (2006.01)
  *H01Q 1/38*        (2006.01)
  *H01Q 1/24*        (2006.01)

(58) Field of Classification Search
  CPC ... H01Q 9/0421; H01Q 1/2266; H05K 9/0067
  USPC ........................................................ 343/700
  See application file for complete search history.

(56)             References Cited

U.S. PATENT DOCUMENTS 8,624,783  B2 *   1/2014  Kim ...................... H01Q 9/42
                                                     343/702
  9,502,768  B2 *  11/2016  Huang .................... H01Q 1/44
  9,948,000  B2 *   4/2018  Hu ....................... H01Q 1/002
  10,069,196 B1     9/2018  Yen et al.
  10,741,915 B2     8/2020  Chen et al.
  11,145,985 B2 *  10/2021  Wu ....................... H01Q 1/243
  2012/0214412 A1   8/2012  Schlub et al.
  2018/0090847 A1 * 3/2018  Romano ............. H01Q 9/0414

FOREIGN PATENT DOCUMENTS

DE     102020107024 A1 *  9/2020  ............... G01V 3/08
  EP          3293816 A1 *  3/2018  ............ H01Q 1/242
  TW          M460421 U1    8/2013
  TW         201914093 A    4/2019
  TW         202023113 A    6/2020

* cited by examiner

ELECTRONIC DEVICE AND ANTENNA FEEDING DEVICE

CROSS-REFERENCE TO RELATED PATENT APPLICATION

This application claims the benefit of priority to Taiwan Patent Application No. 110108128, filed on Mar. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device and an antenna feeding device, and more particularly to an electronic device and an antenna feeding device with an electrostatic discharge protection.

BACKGROUND OF THE DISCLOSURE

In recent years, the design of electronic devices has been toward the development trend of lightness, thinness and shortness. For 3C products such as laptops and tablets, in order to meet the thin and beautiful design, narrow bezels are introduced in the display device, and at the same time, to take into account the structural strength, metal back covers are often used.

However, with the above structure, it will increase the difficulty in designing the antenna inside the device. In the prior art, it is a design method to design the antenna by disconnecting the metal frame of the relative wavelength in the metal housing. However, in this design method, the electromagnetic waves emitted by the antenna will affect the human body, that is, the SAR (Specific Absorption Rate) is over the specification. In addition, because the location of the antenna is on the edge of the outer frame, the problem of ESD (Electro Static Discharge) damage to electronic components may also arise. Therefore, considering these conditions, the new architecture is studied to meet the antenna characteristics and SAR safety regulations at the same time.

Therefore, it has become an important issue for the industry to overcome the above-mentioned defect through improving structure designs of the electronic devices to meet the antenna characteristics and SAR safety regulations.

SUMMARY OF THE DISCLOSURE

In response to the above-referenced technical inadequacies, the present disclosure provides an electronic device and an antenna feeding device.

In one aspect, the present disclosure provides an electronic device which includes a metal housing, a radiation element, a substrate, and an electrostatic protection element. The radiation element is arranged along the edge of the electronic device. The radiation element is separate from the metal housing. The substrate is disposed on the metal housing. The substrate includes a feeding portion and a grounding portion. The feeding portion is coupled with the radiation element. The grounding portion is coupled with the metal housing. The electronic device further includes a grounding element. The grounding element is electrically connected to the grounding portion. The electrostatic protection element is electrically connected between the feeding portion and the grounding portion.

In another aspect, the present disclosure provides an antenna feeding device. The antenna feeding device includes a substrate and an electrostatic protection element. The substrate is disposed on the metal housing. The substrate includes a feeding portion and a grounding portion. The feeding portion is coupled with the radiation element. The electrostatic protection element is electrically connected to the feeding portion.

One of the beneficial effects of the present disclosure is that the electronic device and the antenna feeding device provide techniques of separation from each other by the radiation element and the metal housing and the electrostatic protection element being electrically connected to the feeding portion. The solution is to use the radiation element as an antenna radiator and a sensor electrode (or sensor pad) at the same time to improve the problem of excessive SAR affecting the human body, and to solve the problem of electrostatic discharge destruction affecting the internal components of the electronic device through the electrostatic protection element.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
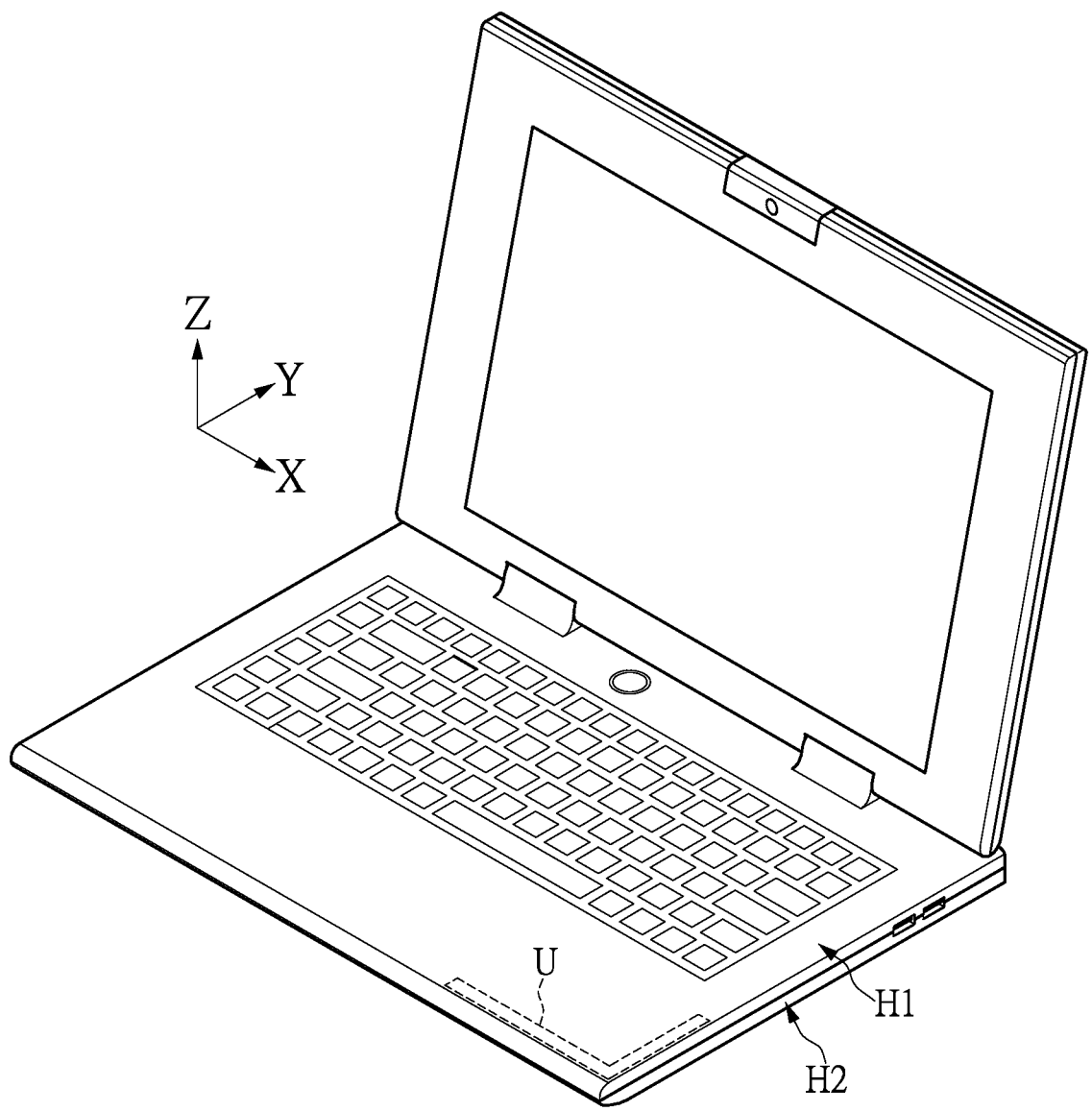
FIG. 1 is a schematic view of an electronic device of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, an embodiment of the present disclosure provides an electronic device D. The electronic device D may have a function of transmitting and receiving radio frequency (RF) signals. For example, the electronic device D can be a smart phone, a tablet, or a laptop, but the present disclosure is not limited thereto. In addition, for example, the electronic device D can generate an operating frequency band ranging from 617 MHz to 5925 MHz, but the present disclosure is not limited thereto.

The present disclosure will take the electronic device D as a laptop as an example. The electronic device D includes a metal housing 1, a radiation element 2, a substrate 3, and an electrostatic protection element 5. Furthermore, the electronic device D may further include a first housing H1 and a second housing H2. The first housing H1 can be a C part of the notebook computer, and the second housing H2 can be a D part of the laptop. The metal housing 1, the radiation part 2, the substrate 3 and the electrostatic protection element 5 are disposed in the electronic device D. And the substrate 3 and the electrostatic protection element 5 form an antenna feeding device U disposed in the electronic device D and used for transmitting and receiving radio frequency signals, that is, the antenna feeding device U includes the substrate 3 and the electrostatic protection element 5, and the antenna feeding U is disposed on the metal housing 1 and coupled with the radiation element 2.

Figure 2:
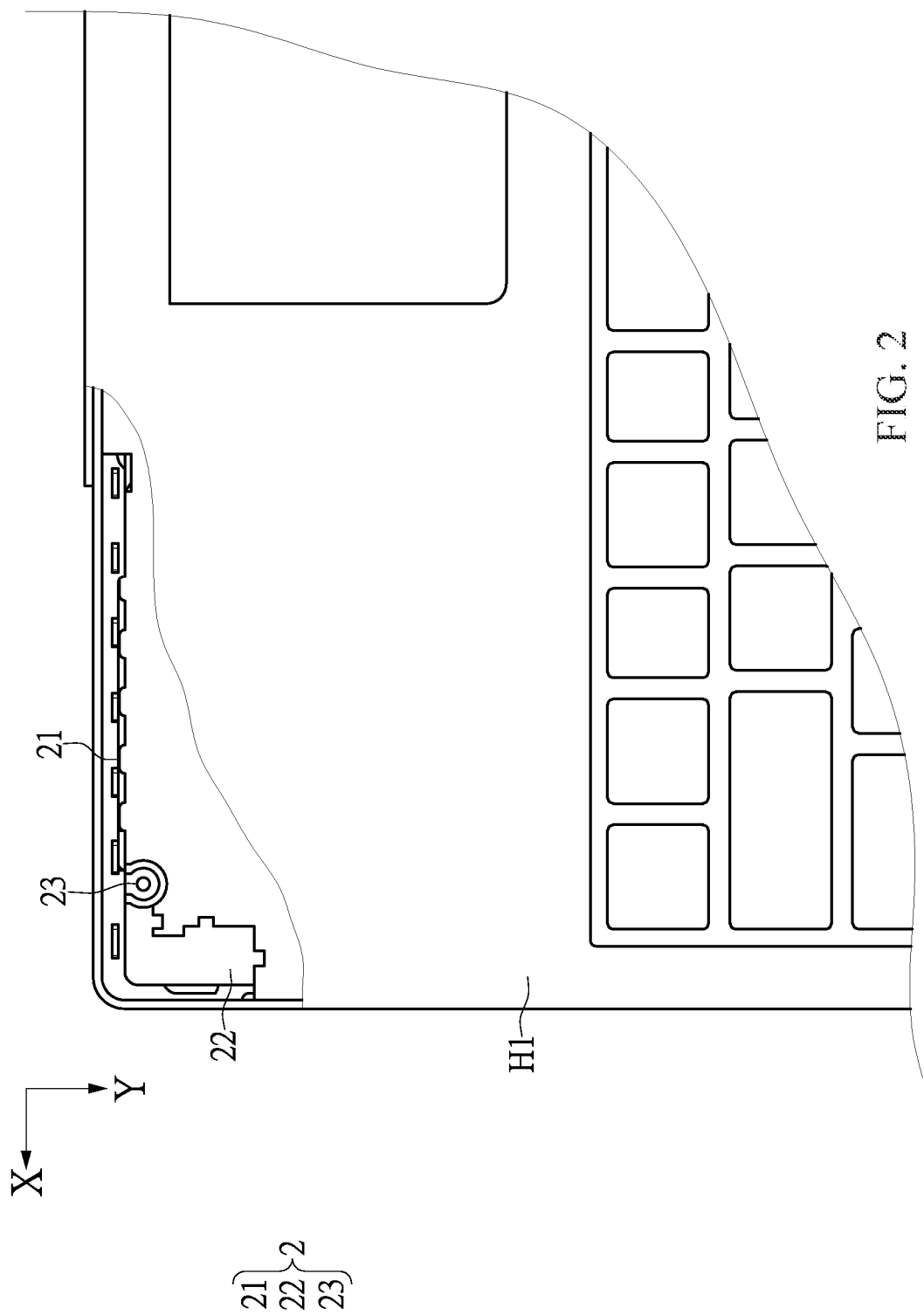
FIG. 2 is a schematic top view of the electronic device without antenna feeding device of the present disclosure.
Figure 3:
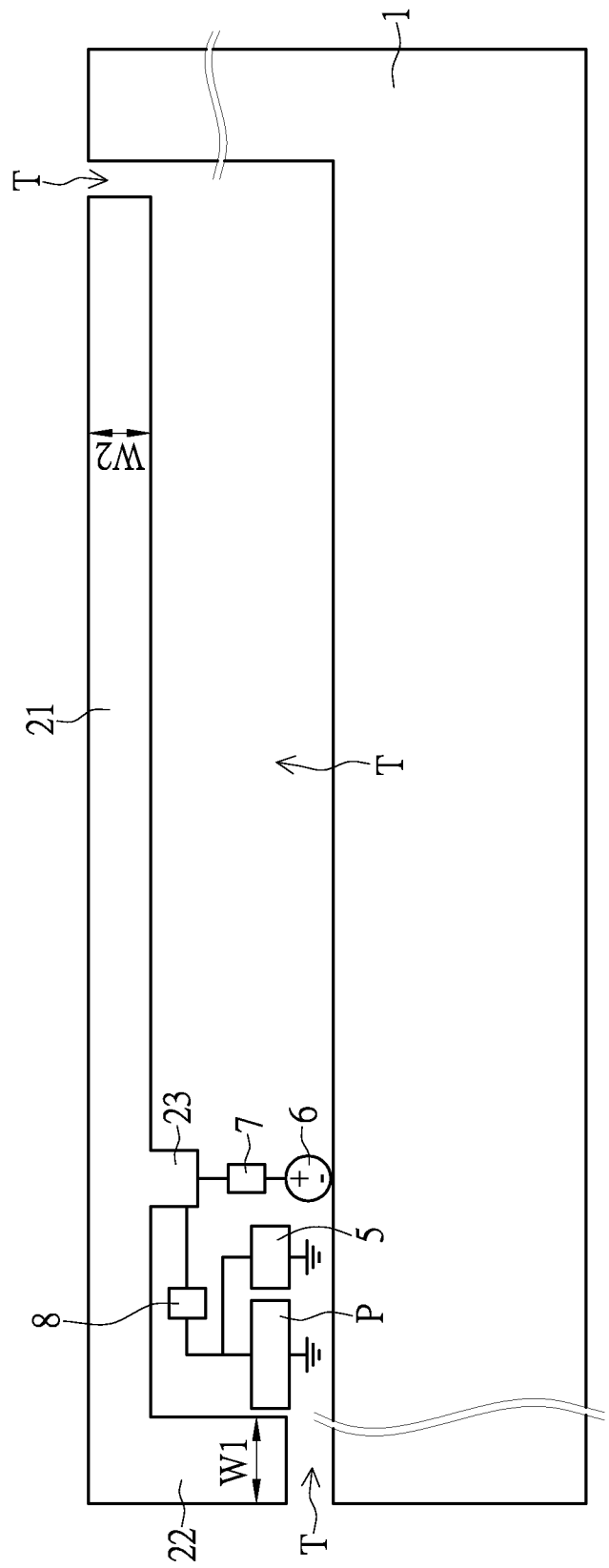
FIG. 3 is a schematic view of separation between a radiation element and metal housing of the electronic device of the present disclosure.

Referring to FIG. 2 and FIG. 3, FIG. 2 is a top schematic view of the electronic device without antenna feeding device. FIG. 3 is a schematic view of separation between a radiation element and metal housing of the electronic device. Specifically, the radiation element 2 is buried inside the electronic device D, and the radiation element 2 is arranged along the edge of the electronic device D. The radiation element 2 and the metal housing 1 are separated from each other, or the two sides of the radiation element 2 are separated from the metal housing 1 to form a clearance area T (as shown in FIG. 3). To be precise, the radiation element 2 itself belongs to a part of the metal housing 1, and it is mainly disposed on the edge of the metal housing 1. That is, the metal frame of the edge. Therefore, after the radiation element 2 (the metal frame on the edge) is disconnected from the metal housing 1, the radiation element 2 forms an independent element, and the disconnection positions between the two sides of the radiation element 2 and the metal housing 1 are formed clearance areas T, respectively.

Figure 4:
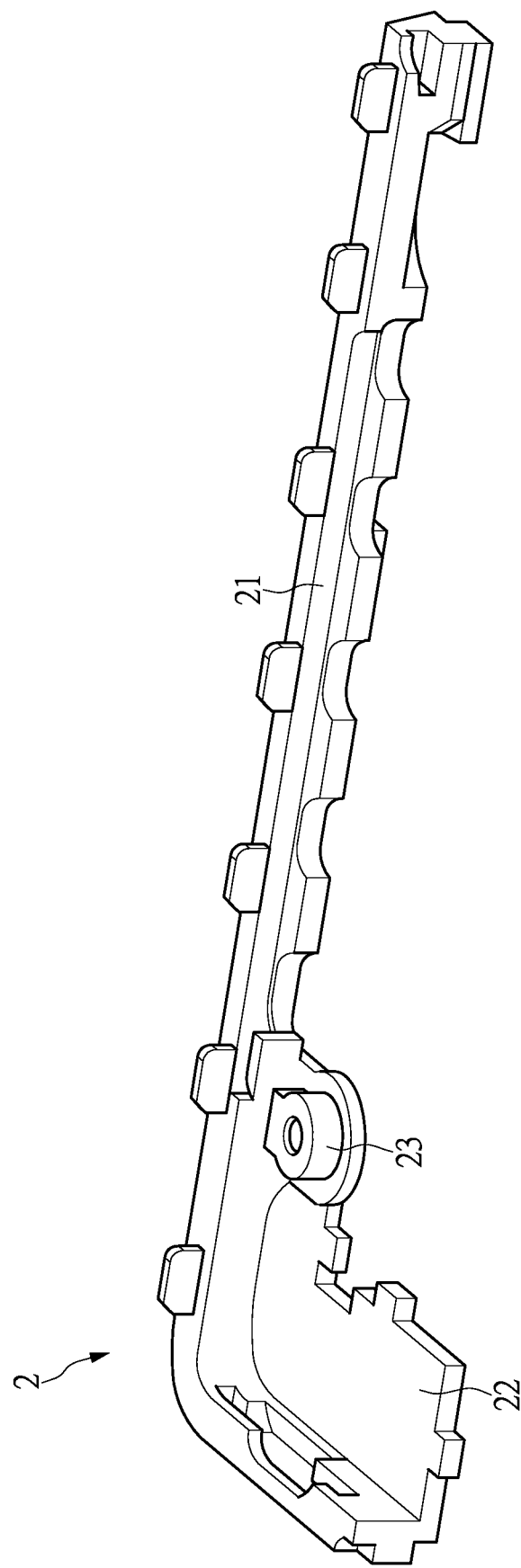
FIG. 4 is a schematic view of the radiation element of the electronic device of the present disclosure.

The specific shape of the radiation element 2 can be seen in FIG. 4. The radiation element 2 includes a long arm 21, a short arm 22, and a metal connection portion 23. The short arm 22 is perpendicularly connected to one end of the long arm 21 to form an L-shaped structure. The metal connection portion 23 is connected at the junction between the long arm 21 and the short arm 22. In addition, it should be noted that in the radiation element 2 shown in FIG. 2, the long arm 21 of the radiation element 2 is arranged along the edge of the electronic device D in the negative X direction, and the short arm 22 is arranged along the electronic device D in the positive Y direction. Referring to FIG. 3 again, the average width W1 of the short arm 22 is greater than the average width W2 of the long arm 21. Thereby, the radiation element 2 can utilize the structural feature that the average width W1 of the short arm 22 is greater than the average width W2 of the long arm 21 to increase the bandwidth of the high frequency band.

Figure 5:
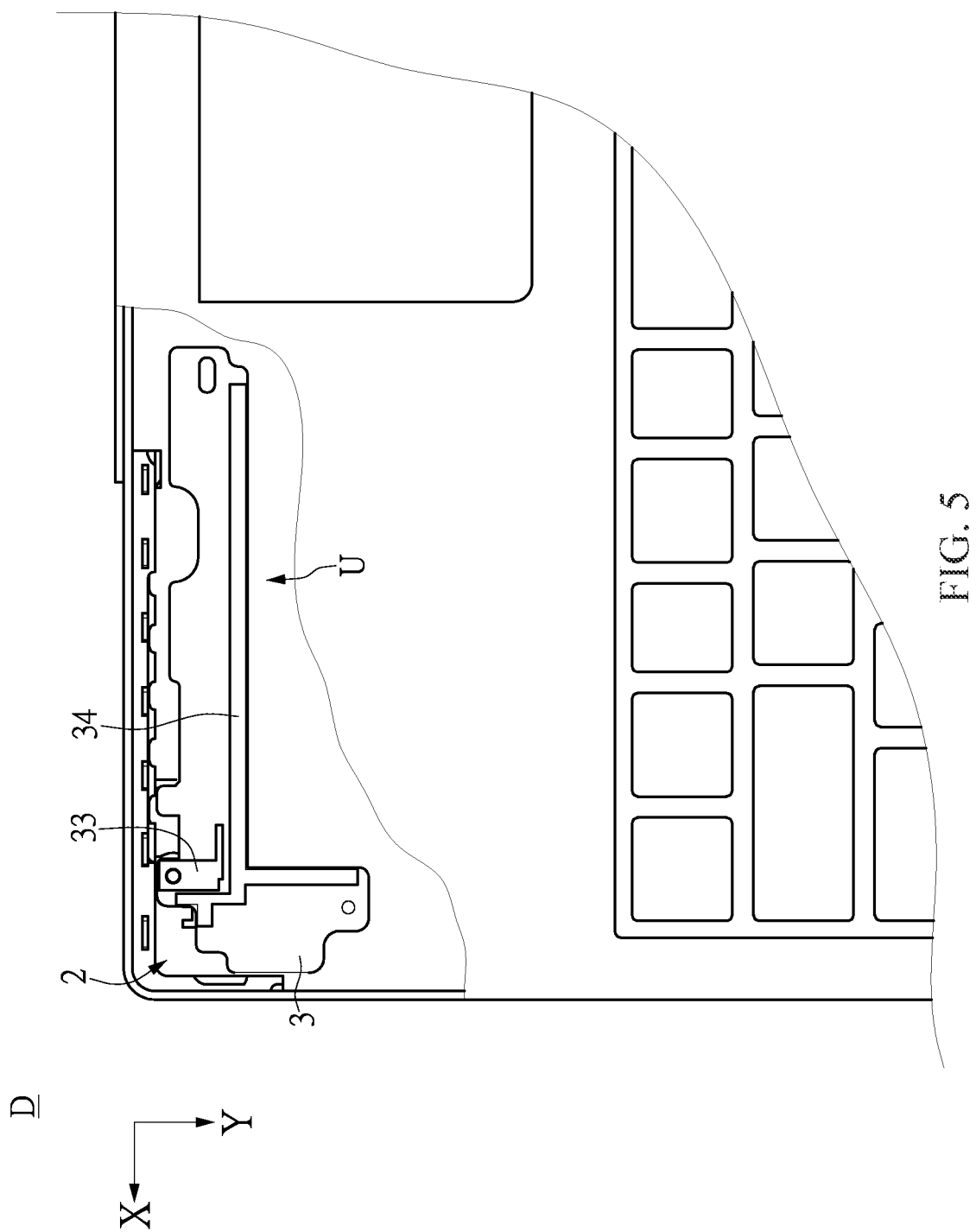
FIG. 5 is a schematic top view of the antenna feeding device embedded inside the electronic device of the present disclosure.
Figure 6:
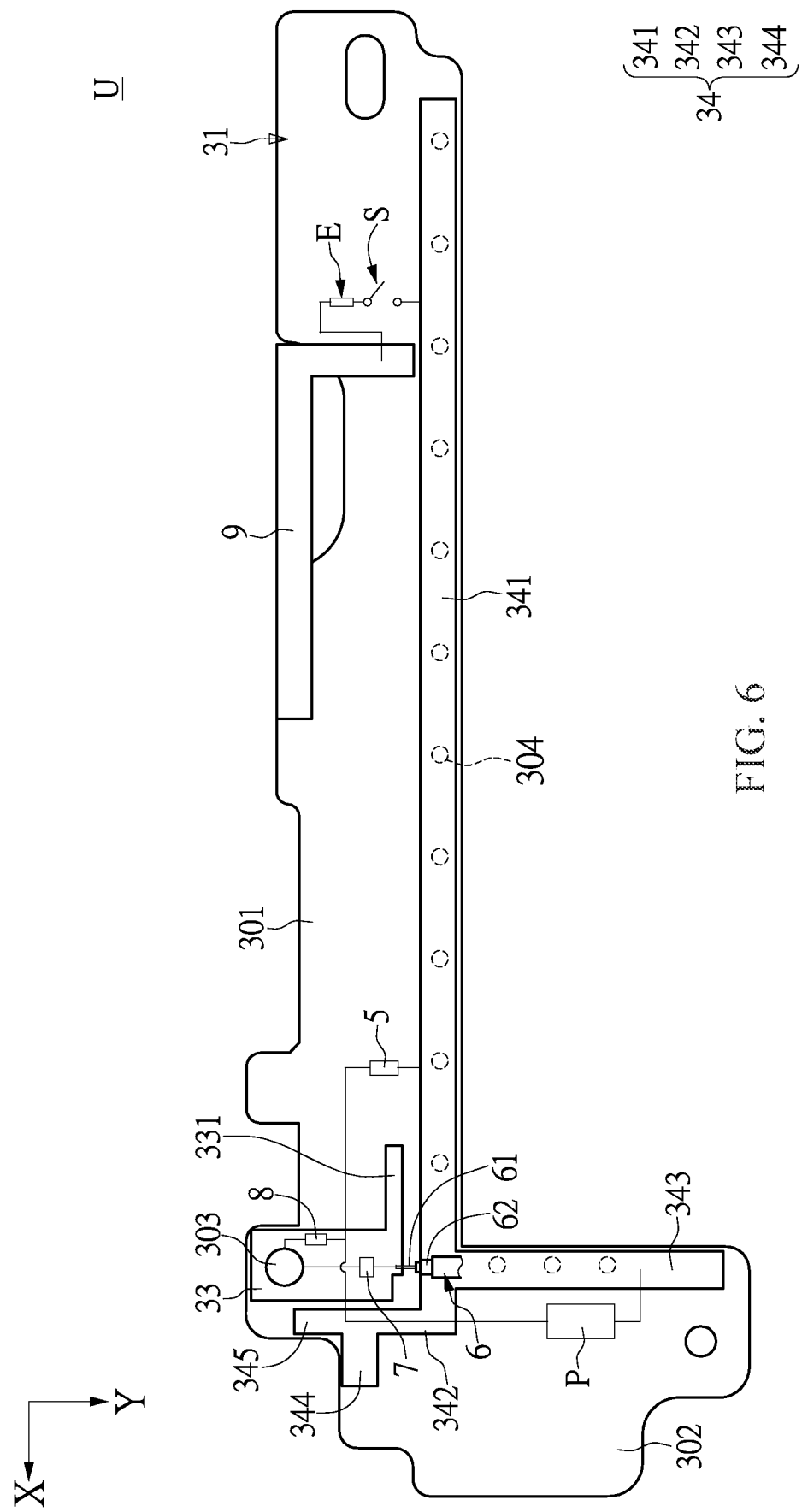
FIG. 6 is a view of a first surface of the antenna feeding device of the present disclosure.
Figure 7:
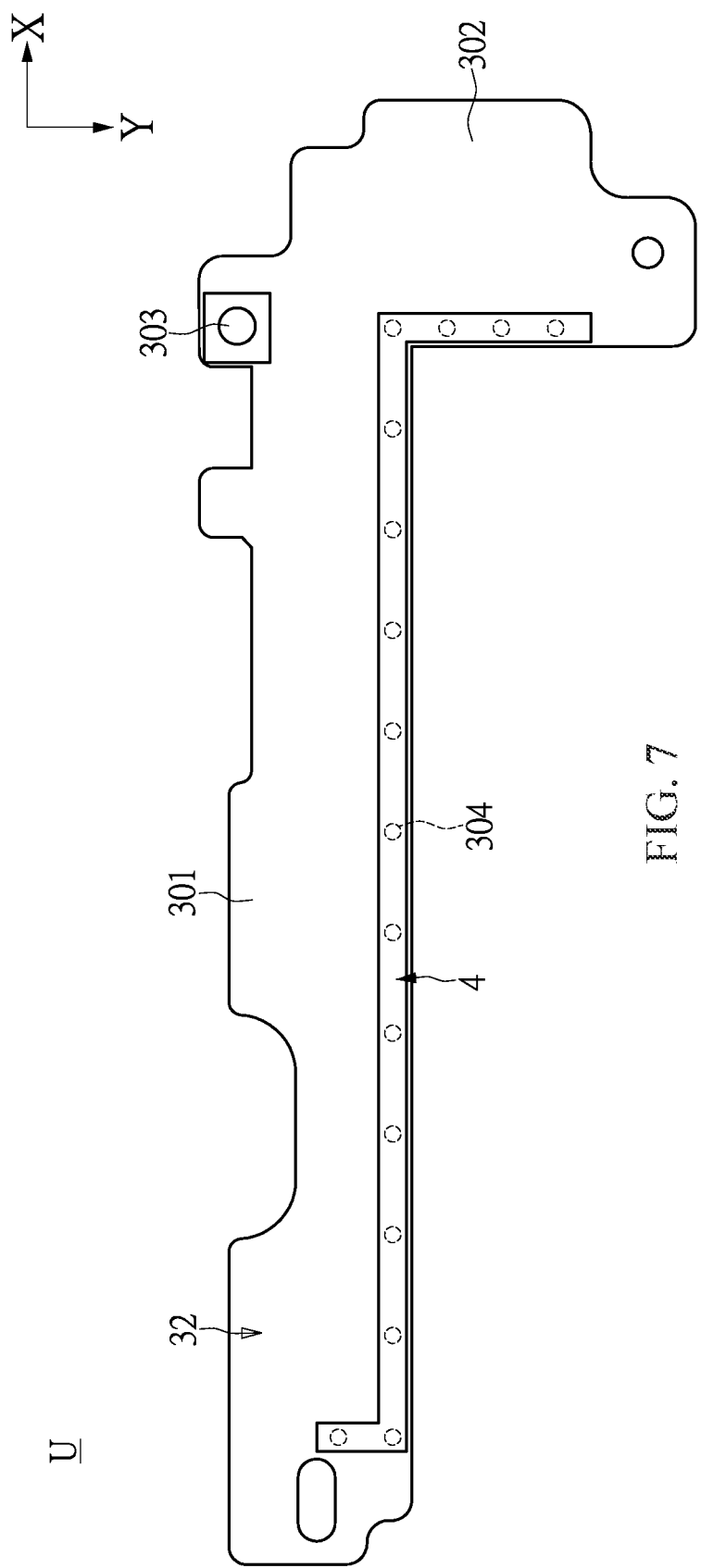
FIG. 7 is a view of a second surface of the antenna feeding device of the present disclosure.

Refer to FIG. 5 to FIG. 7. The antenna feeding device U further includes a grounding member 4, which means that the antenna feeding device U includes the substrate 3, the grounding member 4 and the electrostatic protection element 5. As shown in FIG. 5, when the antenna feeding device U is disposed on the metal housing 1, it is actually superimposed on the radiation element 2. Therefore, the substrate 3 is also disposed on the metal housing 1, and the position of the feeding portion 33 overlaps with the positions of the metal connection portions 23. As shown in FIG. 6, the substrate 3 includes a feeding portion 33, a grounding portion 34, a long body portion 301 and a short body portion 302. The feeding portion 33 is coupled with the radiation element 2, the grounding portion 34 is coupled with the metal housing 1, the long body portion 301 is perpendicularly connected to the short body portion 302. The feeding portion 33 is disposed at the junction between the long body portion 301 and the short body portion 302. The feeding portion 33 has a via hole 303 penetrating the substrate 3. Therefore, when the antenna feeding device U is stacked above the radiation element 2, the position of the via hole 303 overlaps with the position of the metal connection portion 23, and the metal connection portion 23 is electrically connected to the feeding portion 33. As mentioned above, in this embodiment, the metal connection portion 23 is a screw hole, so a stud (not shown) can be used to insert the via hole 303 and the metal connection portion 23 to fix the antenna feeding device U and the radiation element 2. And the feeding portion 33 is coupled with the radiation element 2, thereby electrically connecting the antenna feeding device U and the radiating element 2. The antenna feeding device U generates an operating frequency band ranging from 617 MHz to 5925 MHz through the radiation element 2.

In this embodiment, the metal connection portion 23 is a screw hole, but the present disclosure is not limited thereto. In other words, the metal connection portion 23 is not necessarily a screw hole, and the feeding portion 33 does not necessarily need to have a via hole 303 penetrating through the substrate 3. The present disclosure does not limit to the connection method between the metal connection portion 23 and the feeding portion 33. For example, the metal connection portion 23 may also have other structural types, such as a surface-mount elastic sheet (SMT metal elastic sheet), which means that the radiation element 2 can be electrically connected to the feeding portion 33 through the SMT metal elastic sheet. Or, for example, the SMT metal elastic sheet may also be provided on the substrate 3 to be electrically connected to the feeding portion 33, and the feeding portion 33 is then electrically connected to the metal connection portion 23 through the SMT metal elastic sheet.

Refer to FIG. 6 and FIG. 7. FIG. 6 is a view of a first surface of the antenna feeding device of the electronic device in this embodiment of the present disclosure. FIG. 7 is a view of a second surface of the antenna feeding device of the electronic device in this embodiment of the present disclosure. The substrate 3 includes a first surface 31 and a second surface 32 in opposite side. The feeding portion 33 and the grounding portion 34 are disposed on the substrate 3. The grounding member 4 is disposed on the second surface 32 and coupled with the metal housing 1. The grounding portion 34 of the antenna feeding device U is grounded through the grounding member 4 (that is, connected to the metal housing 1). For example, the feeding portion 33, the grounding portion 34, and the grounding member 4 may be a metal sheet, a metal wire, or other conductors with conductive effects. The feeding element 6 may be a coaxial cable, and the substrate 3 can be an FR4 (Flame Retardant 4) substrate, a printed circuit board (PCB), or a flexible printed circuit board (FPCB), but the present disclosure is not limited thereto.

For example, the grounding portion 34 includes a first section 341, a second section 342 connected to the first section 341 and turned relative to the first section 341, a third section 343 connected to the first section 341 and turned relative to the second section 342, a fourth section 344 connected to the second section 342 and turned relative to the second section 342, and a fifth section 345 connected to the second section 342. The electronic device D can adjust the operating frequency band (mid-to-high frequency band), impedance matching, return loss and/or radiation efficiency generated by the radiation element 2 through the fourth section 344 and the fifth section 345 of the ground portion 34. The fifth section 345 is coupling to the feeding portion 33. In addition, the feeding portion 33 includes a sixth section 331 coupling to the first section 341 of the grounding portion 34. The electronic device D can adjust the operating frequency band, impedance matching, return loss and/or radiation efficiency generated by the radiation element 2 through the sixth section 331 of the feeding portion 33. Matching, return loss and/or radiation efficiency.

The grounding member 4 is electrically connected to the metal housing 1, and the grounding member 4 is coupled with the grounding portion 34. For example, the grounding portion 34 utilizes a via hole 304 on the substrate 3 so that the grounding portion 34 is coupled with the grounding member 4. In addition, the grounding member 4 includes a layer of conductive foam or a metal elastic sheet. In this embodiment, the grounding member 4 is an example of conductive foam. The conductive foam can be adhered to a grounding member 4 formed by a metal sheet or a metal wire. 4 on. It is worth mentioning that in this embodiment, although the grounding portion 34 is grounded through the grounding member 4, in other embodiments, the grounding member 4 is not necessarily disposed on the second surface 32 of the substrate 3. That is, the antenna feeding device U only includes the substrate 3 and the electrostatic protection element 5). And the grounding portion 34 can also be directly grounded, that is, directly connected to the metal housing 1, that is, the present disclosure does not limit the grounding method of the grounding portion 34. The grounding portion 34 may be grounded by an indirect grounding method through the grounding member 4 being connected to the metal housing 1, or may be grounded by a direct grounding method to the metal housing 1 without the grounding member 4.

Referring to FIG. 2 and FIG. 6, the electrostatic protection element 5 is electrically connected between the feeding portion 33 and the grounding portion 34. Specifically, one end of the electrostatic protection element 5 is electrically connected to the feeding portion 33, and the other end is electrically connected to the ground through the ground portion 34. The electronic device D further includes a feeding element 6, and the feeding element 6 includes a feeding end 61 and a grounding end 62. The feeding end 61 is coupled with the feeding portion 33, and the grounding end 62 is coupled with the grounding portion 34. The antenna feeding device U feeds a signal through the feeding end 61 of the feeding element 6, and the signal is radiated by the radiation element 2 through the feeding portion 33 and then through the metal connection portion 23 of the radiation element 2. That is, the present disclosure is based on the metal frame (i.e., the radiation element 2) of the metal housing 1 is cut off to form a monopole antenna. Furthermore, in the present disclosure, a metal ring is cut off at the edge of the metal housing 1 as the antenna radiator, and a relatively large clearance area T can be formed in the antenna creation so that the antenna has better radiation characteristics.

As mentioned above, although the metal frame as the antenna radiator can have better radiation characteristics, since the radiation element 2 is close to the edge of the electronic device D, electrostatic discharge problems are likely to occur. Therefore, the present disclosure uses a metal frame as the antenna radiator, and at the same time, the electrostatic protection element 5 is electrically connected to the feeding portion 33 to prevent system failures caused by electrostatic discharge or surge. For example, the electrostatic protection element 5 may be a transient voltage suppressor diode, but the present disclosure is not limited thereto.

Continuing to refer to FIGS. 3, 6 and 7, it should be noted that the circuit shown in FIG. 3 is only for convenience of description, and does not mean that the circuit is directly electrically connected to the radiation element. The aforementioned antenna feeding device U is actually stacked above the radiation member 2. The antenna feeding device U feeds a signal through the feeding end 61 of the feeding element 6, and the signal is radiated by the radiation element 2 through the feeding portion 33 and the stud. In addition, the electronic device D further includes at least one capacitor element 7. More specifically, the antenna feeding device U inside the electronic device D includes at least one capacitor element in addition to the substrate 3, the grounding member 4, and the electrostatic protection element 5. At least one capacitor element 7 is connected in series between the feeding portion 33 and the feeding end 61, that is, in series on the conductive path between the feeding portion 33 and the feeding end 61. In addition, at least one capacitor element 7 can also be further used for impedance matching of the antenna feeding device U. It should be noted that the present disclosure is not limited by the number of capacitor elements 7. The electronic device D may also be provided with a plurality of capacitor elements 7 connected in series between the feeding portion 33 and the feeding end 61. In addition, the total equivalent capacitance of at least one capacitor element 7 connected in series between the feeding portion 33 and the feeding end 61 is greater than 6 pF. That is to say, when there is only one capacitor element 7 connected in series between the feeding part 33 and the feeding end 61, the capacitance value of the capacitor element 7 is greater than 6 pF. When there are multiple capacitor elements 7 in series between the feeding part 33 and the feeding end 61, the total equivalent capacitance value of the plurality of capacitor elements 7 is greater than 6 pF. In addition, when multiple capacitor elements 7 are connected in series between the feeding portion 33 and the feeding end 61, the electronic device D can be used with a switching circuit (not shown) to switch different capacitance values, thereby adjusting the antenna matching and resonance frequency offset, So that the antenna feeding device U generates an operating frequency band between 617 MHz and 5925 MHz through the radiation element 2.

Preferably, the electronic device D further includes at least one inductor element 8 and a proximity sensing circuit P. More specifically, the antenna feeding device U inside the electronic device D includes the substrate 3, the grounding member 4, the electrostatic protection element 5 and at least one capacitor element 7. The antenna feeding device U further includes at least one inductor element 8 and a proximity sensing circuit P. At least one inductor element 8 is connected in series between the radiation element 2 and the proximity sensing circuit P, that is, in series on the conductive path between the radiation element 2 and the proximity sensing circuit P. And the proximity sensing circuit P can be directly or indirectly electrically connected to the grounding element 4. In this embodiment, at least one inductor element 8 can be connected in series on the conductive path between the feeding portion 33 and the proximity sensing circuit P, and adjacent to the feeding portion 33. That is to say, at least one inductor element 8 will be as close as possible to the feeding portion 33 on the substrate 3, so as to reduce the transmission path of the high-frequency signal and avoid interference caused by the redundant transmission path of the high-frequency signal. In addition, it should be noted that although the proximity sensing circuit P in FIG. 6 is grounded by connecting the ground portion 34, the present disclosure is not limited to the grounding method of the proximity sensing circuit P, that is, the proximity sensing circuit P can be directly or indirectly electrically connected to the grounding element 4. Through the arrangement of at least one inductor element 8 and a proximity sensing circuit P, the electronic device D may have the function of sensing whether the human body is close to the antenna feeding device U, and then may adjust the radiation power of the antenna feeding device U to avoid biological The specific absorption rate (SAR) of the unit mass to electromagnetic wave energy is too high.

Furthermore, in one of the implementations, the proximity sensing circuit P can be electrically connected to the control circuit (not shown in figures), such that the control circuit is able to adjust the radiation power of the antenna feeding device U through a signal sensed by the proximity sensing circuit P. However, it should be noted that, in other implementations, a circuit or a control unit utilized to receive a signal from the proximity sensing circuit P can be integrated in the proximity sensing circuit P, such that receiving the signal through the control circuit is not additionally required. Therefore, the proximity sensing circuit P can be utilized to sense the distance between an object (such as legs or other body parts of a user) and the antenna feeding device U. Furthermore, the proximity sensing circuit P can be a capacitance sensing circuit. Due to radiation element 2 being separate from the metal housing 1, the radiation element 2 can be regarded as a sensor electrode (a sensor pad), which can be utilized by the proximity sensing circuit P to measure the capacitance. Therefore, the control circuit may determine whether or not the legs or other body parts of the user is within a predetermined detection range adjacent to the antenna feeding device U through a variation of the capacitance sensed by the proximity sensing circuit P. When the legs or other body parts of the user is positioned within a predetermined detection range, the control circuit may decrease the radiation power of the antenna feeding device U to prevent the SAR value from being too high. When the legs or other body parts of the user is positioned outside a predetermined detection range, the control circuit may increase the radiation power of the antenna feeding device U to maintain the overall efficiency of the antenna feeding device U.

It should be noted that the present disclosure is not limited by the number of inductor element 8. The electronic device D may also be provided with a plurality of inductor elements 8 connected in series between the radiation element 2 and the proximity sensing circuit P. In addition, the total equivalent inductance value of at least one inductor element 8 connected in series between the radiation element 2 and the proximity sensing circuit P is greater than 20 nH. That is to say, when there is only one inductance element 8 in series between the radiation element 2 and the proximity sensing circuit P, the inductance value of this inductor element 8 is greater than 20 nH. When there are multiple inductor elements 8 in series between the radiation element 2 and proximity sensing circuit P, the total equivalent inductance value of the plurality of inductor elements 8 is greater than 20 nH. In this way, the present disclosure uses at least one inductance element 8 as a radio frequency choke (RF choke) to avoid mutual interference between the antenna feeding device U and the proximity sensing circuit P, so as to block the AC signal fed by the feeding element 6 (That is, the RF signal) to the sensing circuit P to avoid interference.

Further speaking, the electrostatic protection element 5 is connected in parallel to the proximity sensing circuit P, and one end of the electrostatic protection element 5 and the proximity sensing circuit P are electrically connected at a junction point located between at least one inductor element 8 and the proximity sensing circuit P. In other words, the electrostatic protection element 5 is connected to the system ground before the proximity sensing circuit P, so as to prevent electrostatic discharge or surge from causing damage to the proximity sensing circuit P. In addition, it can also prevent one end of the ESD element from being directly connected to the feeding portion 33. If one end of the electrostatic protection element 5 is directly connected to the feeding portion 33, the high-frequency signal is directly transmitted to the ESD element. It would cause interference between the ESD element and the high-frequency signal and generating noise, which affects the performance of the antenna structure formed by the antenna feeding device U and the radiation element 2. It should be noted that although the electrostatic protection element 5 in FIG. 6 is grounded by connecting the grounding portion 34, the present disclosure is not limited to the grounding method of the electrostatic protection element 5, that is, the electrostatic protection element 5 can be directly or electrically connected to the grounding member 4. In addition, the above-mentioned at least one capacitor element 7 can be used as a DC block to prevent the DC signal generated by the proximity sensing circuit P from transmitting into the system through the feeding element 6 to cause damage to other internal components of the electronic device D.

In addition, continuing to refer to FIG. 6, the electronic device D further includes a parasitic element 9 and a switch circuit S. More specifically, the antenna feeding device U inside the electronic device D includes the substrate 3, the grounding member 4, the electrostatic protection element 5, the at least one inductor element 8, the proximity sensing circuit P, and the at least one capacitance element 7, it may also include the parasitic element 9 and the switch circuit S. The parasitic element 9 is coupled with the grounding member 4. The parasitic element 9 can be a metal microstrip line, and the antenna feeding device U further includes a plurality of passive elements E, but the present disclosure is not limited by the type and number of passive elements. The passive element E may be, for example, at least one inductor, at least one capacitor, at least one resistor, or a combination thereof, and the switch circuit S includes one or more switches. For example, the passive element E can be two inductor, or an inductor and a capacitor, or an inductor, a capacitor, and a resistor. However, it should be noted that in other embodiments, any passive elements may not be provided on the ground path, and the present disclosure is not limited by the placement of passive elements. The switch circuit S and the passive element E are electrically connected between the parasitic element 9 and the grounding member 4, and the electronic device D can be switched to different signal conduction paths through the setting of the switching circuit S. Each signal conduction path is correspondingly provided with a switch and a combination of different passive elements (inductor, capacitor, and/or resistor). The electronic device D can adjust the operating frequency band, impedance matching, return loss value, and/or radiation efficiency of the antenna feeding device U by using the configuration of the passive element E.

One of the beneficial effects of the present disclosure is that the electronic device D and the antenna feeding device U provide techniques of separation from each other by the radiation element 2 and the metal housing 1 to form a clearance area and the electrostatic protection element 5 being electrically connected to the feeding portion 33. The solution is to use the radiation element 2 as an antenna radiator and a sensor electrode (or sensor pad) at the same time to improve the problem of excessive SAR affecting the human body, and to solve the problem of electrostatic discharge destruction affecting the internal components of the electronic device D through the electrostatic protection element 5.

Furthermore, since the radiation element 2 itself is a part of the metal housing 1, and it is mainly arranged on the edge of the metal housing 1. Therefore, the electronic circuit components in the electronic device D (such as the electrostatic protection component 5, the capacitor element 7, and the inductor element 8, the proximity sensing circuit P, etc.) cannot be directly electrically connected to the radiation element 2, but needs to be electrically connected to the radiation element 2 through the substrate 3 of the antenna feeding device U and the feeding portion 33 and the grounding portion 34 thereon.

More specifically, the present disclosure uses at least one inductor element 8 as a radio frequency choke (RF choke) to avoid mutual interference between the antenna feeding device U and the proximity sensing circuit P, so as to block the AC fed by the feeding element 6 The signal (ie, the RF signal) transmitting to the sensing circuit P to cause interference. In addition, the present disclosure uses at least one capacitor element 7 as a DC block to prevent the DC signal generated by the proximity sensing circuit P from transmitting to the system through the feeding element 6 and affecting damage to other components inside the electronic device D.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
a metal housing;
a radiation element arranged along the edge of the electronic device and separate from the metal housing;
a substrate disposed on the metal housing, the substrate including a feeding portion and a grounding portion, the feeding portion coupled with the radiation element, and the grounding portion coupled with the metal housing;
an electrostatic protection element electrically connected between the feeding portion and grounding portion, wherein the electrostatic protection element is electrically connected to the radiation element through the feeding portion; and
at least one inductor element and a proximity sensing circuit, wherein the electrostatic protection element is connected in parallel to the proximity sensing circuit, and one end of the electrostatic protection element and the proximity sensing circuit are electrically connected to a connection point located between the at least one inductor element and the proximity sensing circuit.

2. The electronic device according to claim 1, wherein the radiation element includes a long arm, a short arm and a metal connection portion, the short arm is perpendicularly connected to one end of the long arm, the metal connection portion is connected to the junction between the long arm and the short arm, and the feeding portion is electrically connected to the metal connection portion.

3. The electronic device according to claim 2, wherein the long arm and the short arm are connected to form an L-shaped structure, and the average width of the short arm is greater than the average width of the long arm.

4. The electronic device according to claim 2, wherein the substrate further includes a long body portion and a short body portion, the short body portion is perpendicularly connected to the long body portion, the feeding portion is disposed at the junction between the long body portion and the short body portion, and the position of the feeding portion overlaps with the position of the metal connection portion.

5. The electronic device according to claim 4, further comprising a feeding element and at least one capacitor element, the feeding element including a feeding end and a grounding end, the feeding end coupled with the feeding portion, the grounding end coupled with the grounding portion, and the at least one capacitor element connected in series between the feeding portion and the feeding end.

6. The electronic device according to claim 1, further comprising a grounding element, the grounding element electrically connected to the metal housing and the grounding element coupled with the grounding portion.

7. The electronic device according to claim 5, wherein the capacitance value of the at least one capacitor element is greater than 6 pF.

8. The electronic device according to claim 1, the at least one inductor element connected in series between the feeding portion and the proximity sensing circuit, and the at least one inductor element being adjacent to the feeding portion.

9. The electronic device according to claim 8, wherein the inductance value of the at least one inductor element is greater than 20 nH.

10. The electronic device according to claim 6, further comprising a parasitic element and a switch circuit, the parasitic element coupled with the grounding element, and the switch circuit electrically connected between the parasitic element and the grounding element.

11. The electronic device according to claim 1, wherein the electrostatic protection element is a transient voltage suppressor diode.

12. The electronic device according to claim 1, wherein the radiation element is a monopole antenna.

13. An antenna feeding device, disposed on a metal housing and coupled with a radiation element, the radiation element being separate from the metal housing, the antenna feeding device comprising:
 a substrate disposed on the metal housing, the substrate including a feeding portion and a grounding portion, the feeding portion coupled with the radiation element, and the grounding portion coupled with the metal housing;
 an electrostatic protection element electrically connected between the feeding portion and grounding portion, wherein the electrostatic protection element is electrically connected to the radiation element through the feeding portion; and
 at least one inductor element and a proximity sensing circuit, wherein the electrostatic protection element is connected in parallel to the proximity sensing circuit, and one end of the electrostatic protection element and the proximity sensing circuit are electrically connected to a connection point located between the at least one inductor element and the proximity sensing circuit.

14. The antenna feeding device according to claim 13, wherein the substrate further includes a long body portion and a short body portion, the short body portion is perpendicularly connected to the long body portion, the feeding portion is disposed at the junction between the long body portion and the short body portion, and the position of the feeding portion overlaps with the position of the metal connection portion.

15. The electronic device according to claim 14, further comprising at least one capacitor element, the at least one capacitor element connected in series between the feeding portion and a feeding end of the feeding element, and the at least one inductor element connected in series between the feeding portion and the proximity sensing circuit.

16. The electronic device according to claim 15, wherein the capacitance value of the at least one capacitor element is greater than 6 pF and the inductance value of the at least one inductor element is greater than 20 nH.

17. The electronic device according to claim 13, further comprising a grounding element, the grounding element electrically connected to the metal housing and the grounding element coupled with the grounding portion.

18. The electronic device according to claim 17, further comprising a parasitic element and a switch circuit, the parasitic element coupled with the grounding element, and the switch circuit electrically connected between the parasitic element and the grounding element.

* * * * *